(12) United States Patent
Lu

(10) Patent No.: US 7,648,902 B2
(45) Date of Patent: Jan. 19, 2010

(54) MANUFACTURING METHOD OF REDISTRIBUTION CIRCUIT STRUCTURE

(75) Inventor: Xuan-Feng Lu, Shanghai (CN)

(73) Assignee: ChipMOS Technologies (Bermuda) Ltd., Hamilton (BM)

( * ) Notice: Subject to any disclaimer, the term of this patent is extended or adjusted under 35 U.S.C. 154(b) by 0 days.

(21) Appl. No.: 12/352,592

(22) Filed: Jan. 12, 2009

(65) Prior Publication Data

US 2009/0130839 A1 May 21, 2009

Related U.S. Application Data

(62) Division of application No. 11/693,734, filed on Mar. 30, 2007, now Pat. No. 7,498,251.

(30) Foreign Application Priority Data

Jan. 15, 2007 (CN) .......................... 2007 1 0000954

(51) Int. Cl.
*H01L 23/485* (2006.01)
(52) U.S. Cl. ........................ 438/614; 438/720; 438/951; 257/E23.02; 257/E21.305
(58) Field of Classification Search ................. 438/614, 438/720, 951, FOR. 343, FOR. 455; 257/E23.02, 257/E21.305
See application file for complete search history.

(56) References Cited

U.S. PATENT DOCUMENTS

| 5,902,686 | A * | 5/1999 | Mis | 428/629 |
| 6,197,613 | B1 * | 3/2001 | Kung et al. | 438/106 |
| 6,329,608 | B1 * | 12/2001 | Rinne et al. | 174/261 |
| 6,358,836 | B1 * | 3/2002 | Lu et al. | 438/618 |
| 6,492,198 | B2 * | 12/2002 | Hwang | 438/108 |
| 7,338,890 | B2 * | 3/2008 | Lee et al. | 438/613 |
| 7,498,251 | B2 * | 3/2009 | Lu | 438/613 |
| 2005/0189650 | A1 * | 9/2005 | Lee et al. | 257/738 |
| 2008/0079150 | A1 * | 4/2008 | Simon et al. | 257/737 |

* cited by examiner

*Primary Examiner*—George Fourson
(74) *Attorney, Agent, or Firm*—Jianq Chyun IP Office

(57) ABSTRACT

A method of manufacturing a redistribution circuit structure is provided. First, a substrate is provided. The substrate has a plurality of pads and a passivation layer. The passivation layer has a plurality of first openings exposing a portion of each of the pads, respectively. A first patterned photoresist layer is formed on the passivation layer. The first patterned photoresist layer has a plurality of second openings exposing a portion of each of the pads. A plurality of first bumps is formed in the second openings, respectively. An under ball metal (UBM) material layer is formed over the substrate to cover the first patterned photoresist layer and the first bumps. A plurality of conductive lines is formed on the UBM material layer. The UBM material layer is patterned to form a plurality of UBM layers using the conductive lines as a mask.

8 Claims, 5 Drawing Sheets

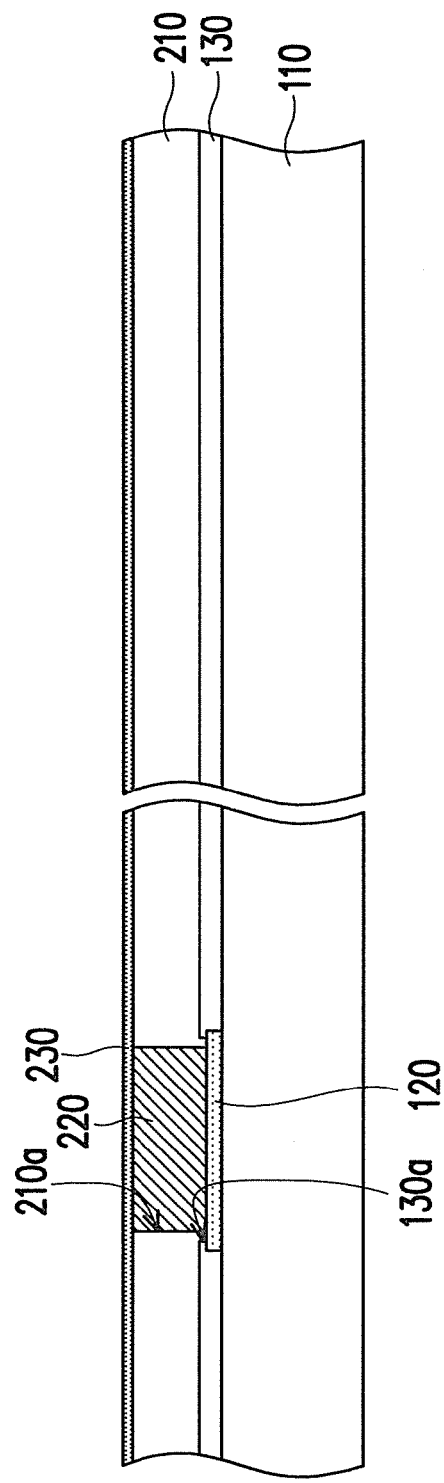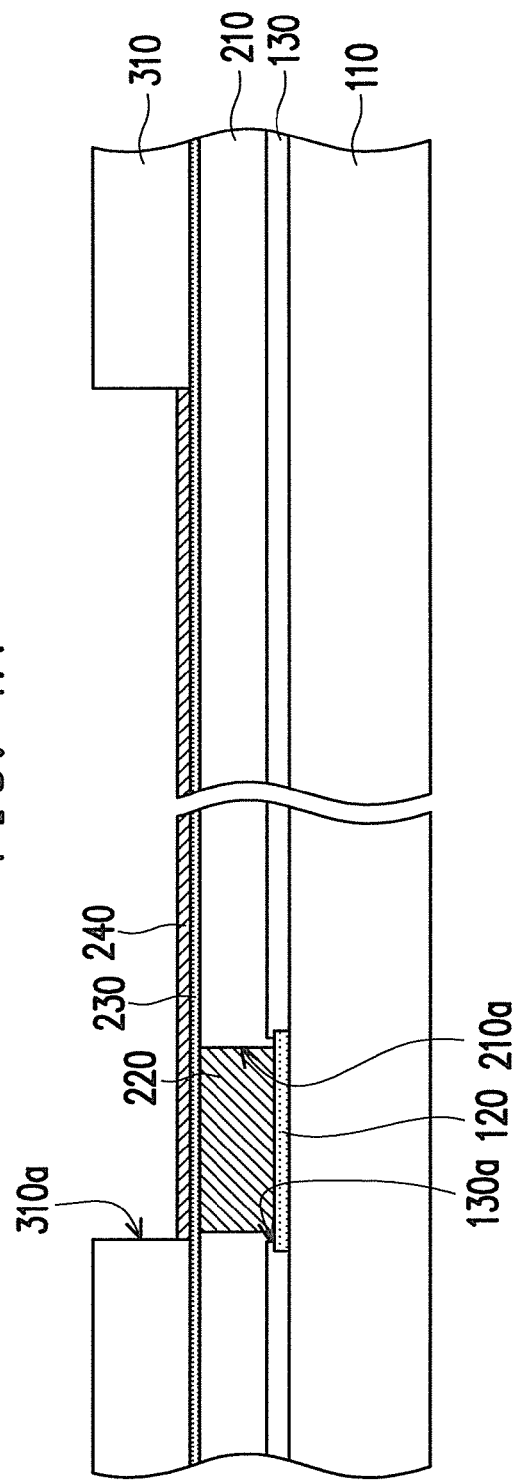

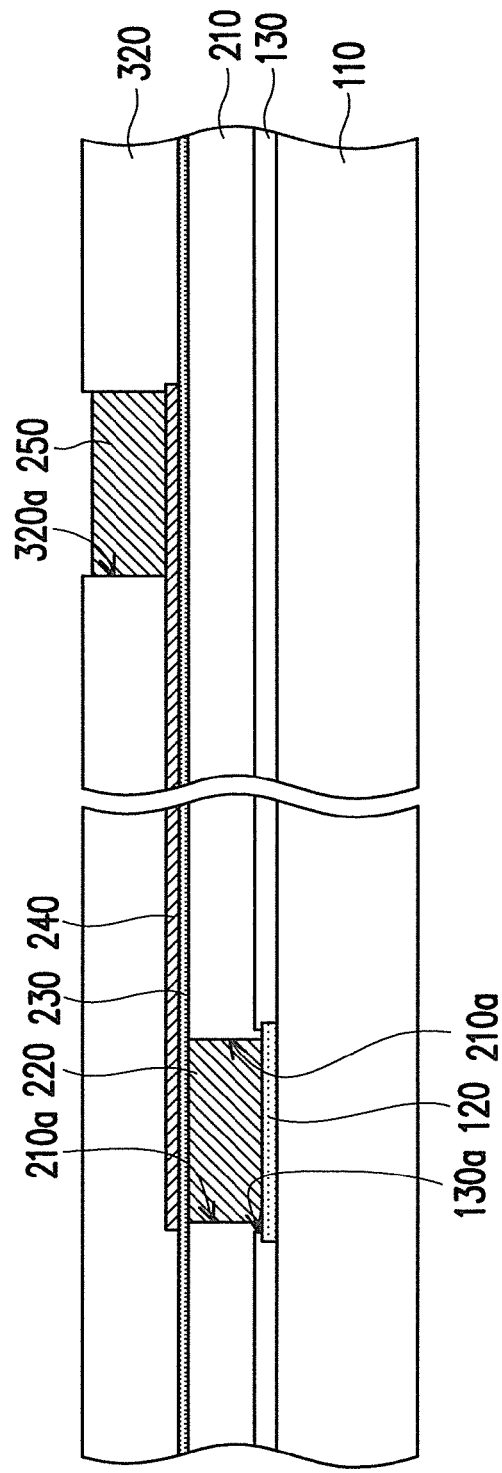
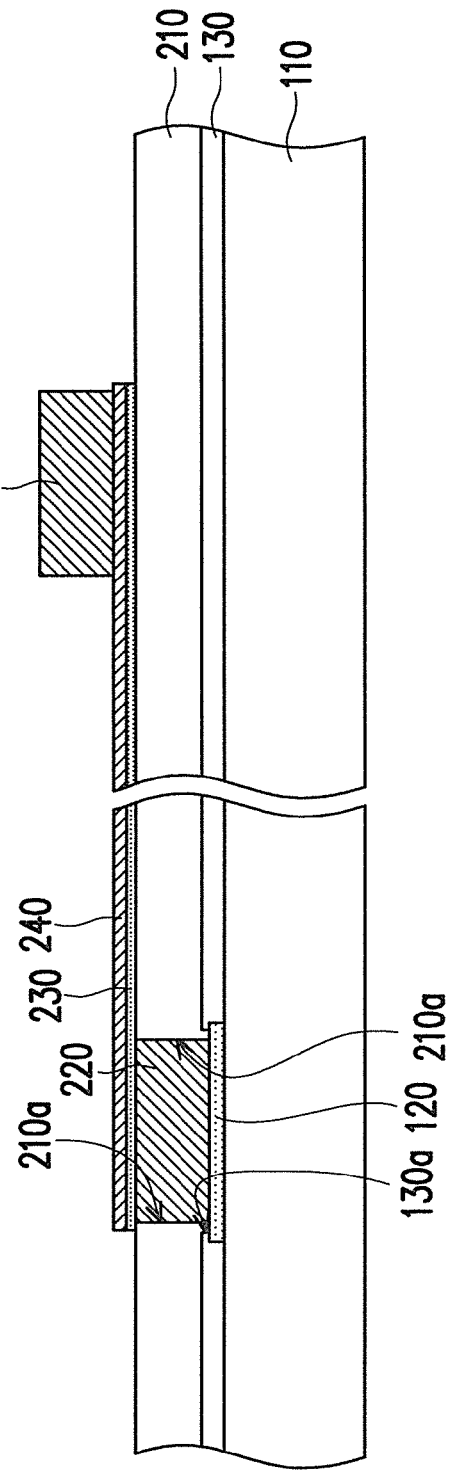
FIG. 2C
FIG. 2D

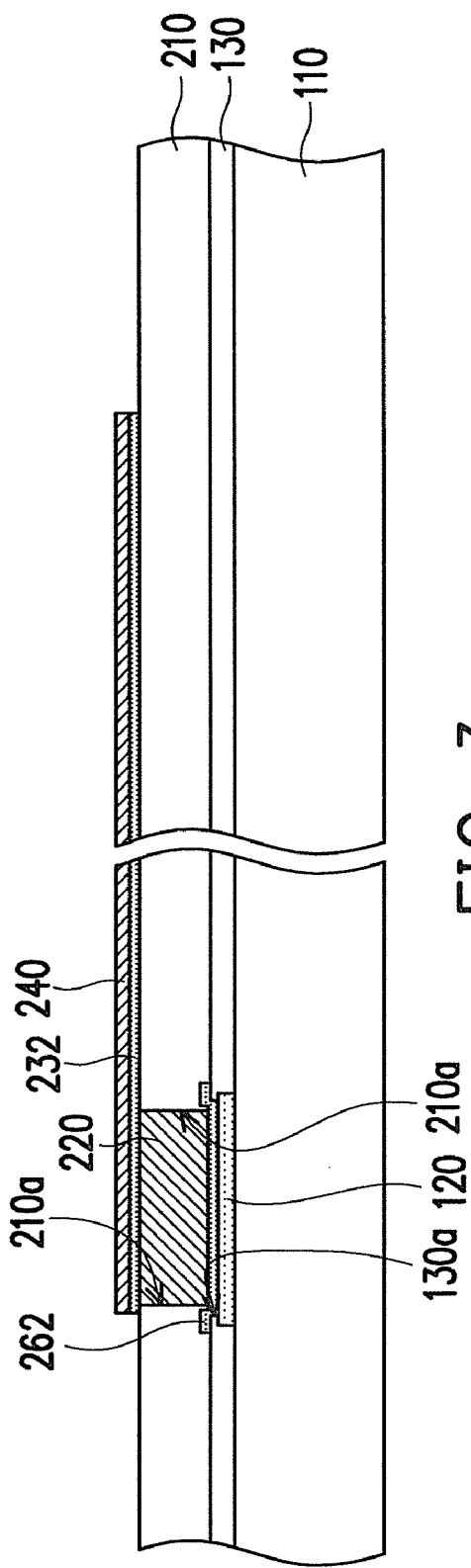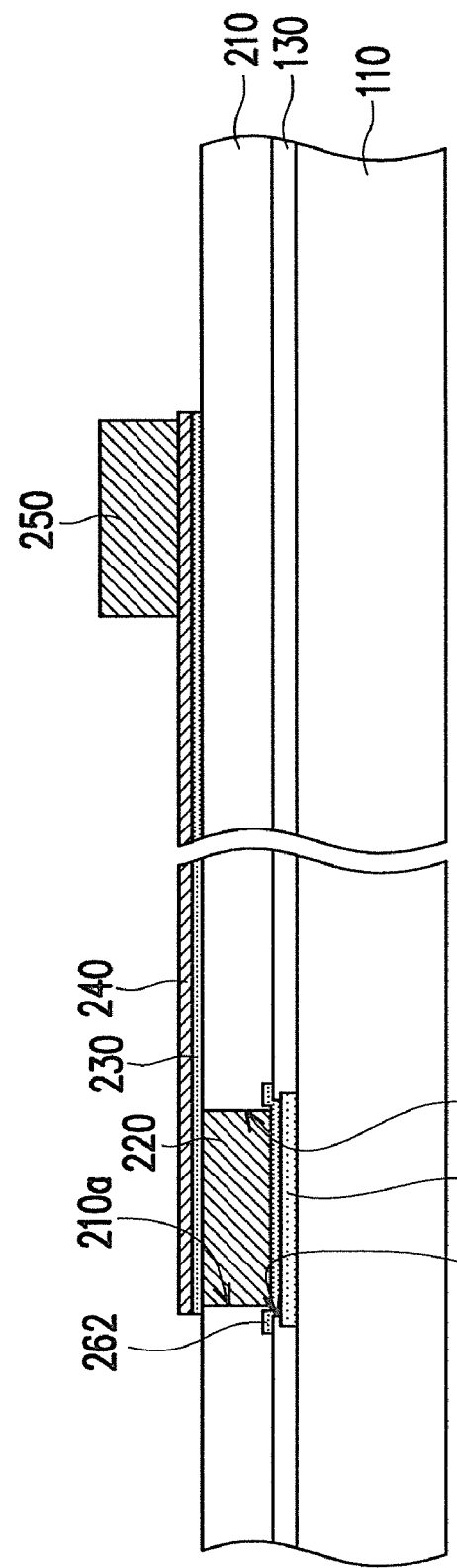

MANUFACTURING METHOD OF REDISTRIBUTION CIRCUIT STRUCTURE

CROSS-REFERENCE TO RELATED APPLICATION

This is a divisional application of and claims priority benefit of patent application Ser. No. 11/693,734, filed on Mar. 30, 2007,now U.S. Pat. No. 7,498,251 now allowed, which claims the priority benefit of P.R.C. application serial no. 200710000954.2, filed on Jan. 15, 2007. The entirety of each of the above-mentioned patent applications is hereby incorporated by reference herein and made a part of this specification.

BACKGROUND OF THE INVENTION

1. Field of the Invention

The present invention relates to a circuit structure, and more particularly to a redistribution circuit structure and manufacturing method thereof.

2. Description of Related Art

With the rapid development in the electronics industry, semiconductors are adopted everywhere. In response to the requirements in the electronics industry, many types of techniques related to the semiconductor process are also rapidly developed. In general, semiconductor processes can be roughly divided into front-end processes and back-end processes. The front-end processes include the formation of a semiconductor substrate such as silicon growth and epitaxial growth and the fabrication of semiconductor devices such as metal oxide semiconductor (MOS) and multi-layered metal interconnections. The back-end processes include the packaging process for protecting the chips, preventing moisture from getting to the chips and avoiding damage by external forces. Furthermore, the connection points on the package body permits electrical connection of the chips with electronic devices outside the package.

Packages can be roughly classified into wire bond (WB) process, tape automatic bonding (TAB) and flip chip (FC) process. The wire bond process is one of the more fully developed techniques and is a widely used technique in many types of electronic packages. In the wire bond process, conductive wires are used to connect contacts on a chip with contacts on a carrier so that the chip may transmit electrical signals to the external. The carrier is a package substrate or a lead frame, for example. In general, the connection points of the chip are disposed not too far away from the contacts of the carrier to facilitate the wire bonding process. However, due to changes in the locations of the contacts of the carrier or in response to the requirements of a different product, the distance between the connection points of the chip and the contacts of the carrier may be too long. As a result, the strength of conductive wires may be low or other electrical problems due to the long conductive wires may emerge. Thus, redistribution process has to be applied to change the circuit layout of the external contacts on the chip. It should be noted that an auxiliary bonding force has to be applied in the wire bonding process. Hence, the area underneath the pads needs to hold out against substantial impact energy. Therefore, electronic components are normally not disposed underneath the pads to prevent the image energy from damaging those devices. Yet, the area of the chip is increased due to the redistribution.

SUMMARY OF THE INVENTION

Accordingly, the present invention is directed to a method of manufacturing a redistribution structure capable of lowering the possibility of the damage in a chip due to the impact energy.

The present invention is also directed to a redistribution circuit structure having better reliability.

The invention provides a method of manufacturing a redistribution circuit structure comprising the following steps. First, a substrate is provided. The substrate has a plurality of pads and a passivation layer. The passivation layer has a plurality of first openings exposing a portion of each of the pads, respectively. A first patterned photoresist layer is formed on the passivation layer. The first patterned photoresist layer has a plurality of second openings exposing a portion of each of the pads. A plurality of first bumps is formed in the second openings, respectively. A first under ball metal (UBM) material layer is formed over the substrate to cover the first patterned photoresist layer and the first bumps. A plurality of conductive lines is formed on the first UBM material layer above the first bumps. The first UBM material layer is patterned to form a plurality of first UBM layers using the conductive lines as a mask.

In an embodiment of the present invention, the step for forming the conductive lines includes forming a second patterned photoresist layer on the first UBM material layer. The second patterned photoresist layer has a plurality of third openings exposing the first UBM material layer above the first bumps, respectively. A plurality of conductive lines is formed in the third openings. Finally, the second patterned photoresist layer is removed.

In an embodiment of the present invention, the method of manufacturing the redistribution circuit structure further includes forming a plurality of second bumps on the conductive lines after forming the conductive lines.

In an embodiment of the present invention, the step for forming the second bumps includes forming a third patterned photoresist layer on the first UBM material layer and a portion of the conductive lines. The third patterned photoresist layer has a plurality of fourth openings exposing a portion each of the conductive lines, respectively. The second bumps are formed in the fourth openings. Finally, the third patterned photoresist layer is removed.

In an embodiment of the present invention, the material of the second bumps includes gold.

In an embodiment of the present invention, the material of the conductive lines includes copper.

In an embodiment of the present invention, the material of the first bumps includes aluminum.

In an embodiment of the present invention, the material of the pads and the material of the first bumps are different. The method of manufacturing the redistribution circuit structure further includes forming a second UBM layer over the passivation layer to cover the pads exposed by the first openings before forming the first patterned photoresist layer.

The present invention also provides a redistribution circuit structure suitable for disposing on a substrate. The substrate has a pad and a passivation layer. The passivation layer has an opening exposing a portion of the pad. The redistribution circuit structure includes a first bump, a patterned photoresist layer, a first under ball metal (UBM) layer and a conductive line. The first bump is disposed inside the opening and is electrically connected to the pad. The patterned photoresist layer is disposed on the passivation layer and exposes the first bump. The first UBM layer is disposed on the first bump and a portion of the patterned photoresist layer, and the conductive line is disposed on the first UBM layer.

In an embodiment of the present invention, the area of the first bump is smaller than the area of the opening.

In an embodiment of the present invention, the conductive line has an area greater than the area of the first bump.

In an embodiment of the present invention, the redistribution circuit structure further includes a second bump disposed on the conductive line.

In an embodiment of the present invention, the material of the second bumps includes gold.

In an embodiment of the present invention, the material of the conductive lines includes copper.

In an embodiment of the present invention, the material of the first bumps includes aluminum.

In an embodiment of the present invention, a multi-layered bump structure further includes a second UBM layer disposed inside the first opening and located between the pad and the first bump.

Accordingly, since a patterned photoresist layer is disposed underneath the conductive line to serve as a buffer layer in the present invention, a chip using this type of redistribution circuit structure is able to absorb larger impact energy. In other words, the chip using the redistribution circuit structure of the present invention has better reliability.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A through 1C are schematic cross-sectional views showing a method of manufacturing a redistribution circuit structure according to a first embodiment of the present invention.

FIGS. 2A through 2D are schematic cross-sectional views showing a method of manufacturing a redistribution circuit structure according to a second embodiment of the present invention.

FIG. 3 is a schematic cross-sectional view of a redistribution circuit structure according to a third embodiment of the present invention.

FIG. 4 is a schematic cross-sectional view of a redistribution circuit structure according to a fourth embodiment of the present invention.

DESCRIPTION OF EMBODIMENTS

Figure 1C:
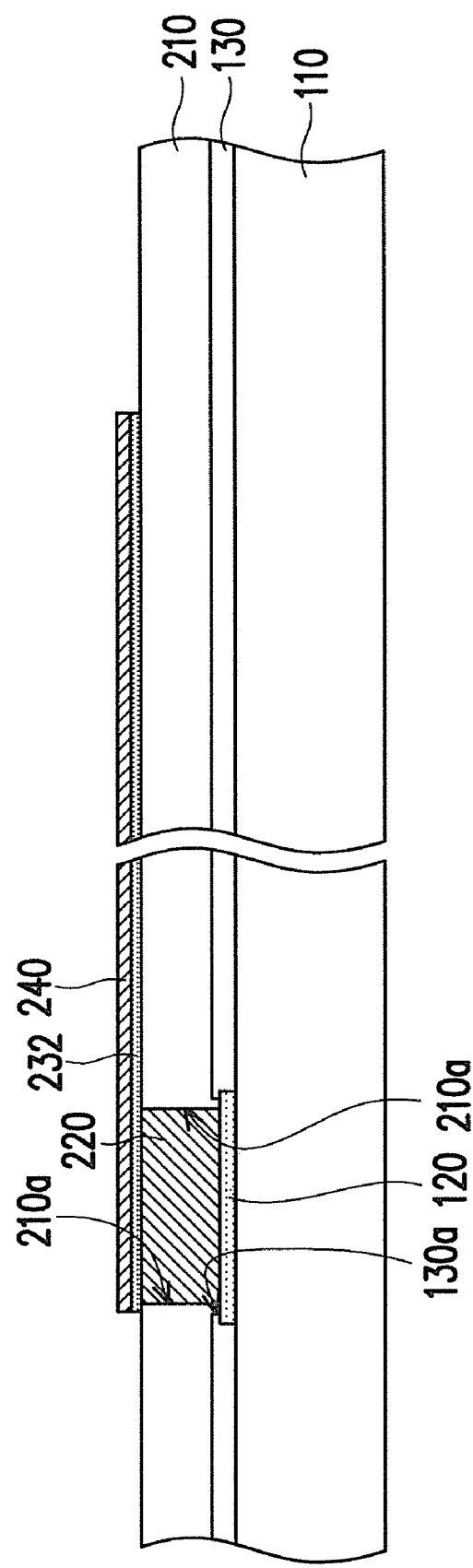

Reference will now be made in detail to the present embodiments of the invention, examples of which are illustrated in the accompanying drawings. Wherever possible, the same reference numbers are used in the drawings and the description to refer to the same or like parts.

First Embodiment

FIGS. 1A through 1C are schematic cross-sectional views showing a method of manufacturing a redistribution circuit structure according to a first embodiment of the present invention. As shown in FIG. 1A, the method of manufacturing the redistribution circuit structure of the present embodiment includes the following steps. First, a substrate 110 is provided. The substrate 110 has a plurality of pads 120 and a passivation layer 130. The passivation layer 130 has a plurality of first openings 130a and each first opening 130a exposes a portion of the corresponding pad 120. It should be noted that only one first opening 130a and one pad 120 are displayed in the present embodiment to simplify the description. In addition, the substrate 100 may be a wafer or other type of carrier, and the material of the pad 120 may be aluminum, copper or other metal.

As shown in FIG. 1A, a first patterned photoresist layer 210 is formed on the passivation layer 130. The first patterned photoresist layer 210 has a plurality of second openings and each second opening exposes a portion of the corresponding pad 120. It should be noted that the second opening 210a is smaller than the pad 120 and the first opening 230a. Thereafter, a first bump 220 is formed inside the second opening 210a. In other words, a plurality of first bumps 220 is formed on the pads 120 exposed by the passivation layer 130. The method of forming the first bumps 220 includes an electroplating process, for example. In the present embodiment, the first bumps 220 are aluminum bumps. However, in other embodiments, the first bumps 220 may be fabricated by using other metallic materials.

As shown in FIG. 1A, an under ball metal (UBM) material layer 230 is formed over the substrate 110 to cover the first patterned photoresist layer 210 and the first bumps 220. In addition, the method of forming the UBM material layer 230 includes a sputtering process or other physical vapor deposition process.

As shown in FIG. 1B, a second patterned photoresist layer 310 is formed on the UBM material layer 230. The second patterned photoresist layer 310 has a plurality of third openings 310a exposing the UBM material layer 230 above the first bumps 220. Thereafter, a plurality of conductive lines 240 is formed in the openings 310a. The method of forming the conductive lines 240 includes an electroplating process, for example. In the present embodiment, the conductive lines 240 are made using copper. However, in other embodiments, the conductive lines 240 may be fabricated from other metal.

As shown in FIGS. 1B and 1C, the second patterned photoresist layer 310 is removed to expose the UBM material layer 230. After that, an etching process is performed to remove a portion of the UBM material layer 230 and form a UBM layer 232 using the conductive lines 240 as a mask. Up to this point, the process of manufacturing the redistribution circuit structure according to the present embodiment is substantially complete. Additionally, the substrate 110 may be cut to form a plurality of chips (not shown) after forming the UBM layer 232. The detail structure of a redistribution circuit is further described below.

As shown in FIG. 1C, the redistribution circuit structure is suitable for disposing on a substrate 110. The substrate 110 has a pad 120 and a passivation layer 130. The passivation layer 130 has a first opening 130a exposing a portion of the pad 120. In addition, the substrate 110 can be a chip or a wafer. The redistribution circuit structure includes a first patterned photoresist layer 210, a first bump 220, an under ball metal (UBM) layer 232 and a conductive line 240. The first bump 220 is disposed inside the first opening 130a and electrically connected to the pad 120. The bottom area of the first bump 220 is smaller than the bottom area of the first opening 130a. The first patterned photoresist layer 210 is disposed on the passivation layer 130 and exposes the first bump 220. In other words, the first patterned photoresist layer 210 has a second opening 210a exposing a portion of the pad 120 and the first bump 220 is disposed inside the second opening 210a. The UBM layer 232 is disposed on the first bump 220 and a portion of the first patterned photoresist layer 210. The conductive line 240 is disposed on the UBM layer 232. Furthermore, the area of the conductive line 240 is larger than the area of the first bump 220.

Since the first patterned photoresist layer 210 is disposed underneath a portion of the conductive line 240 and the UBM layer 232, the first patterned photoresist layer 210 may serve as a buffer layer when a wire bonding process on the redistribution circuit structure is performed. Hence, the possibility of damaging the circuit structure underneath the first patterned photoresist layer 210 is minimized.

Second Embodiment

Figure 2A:
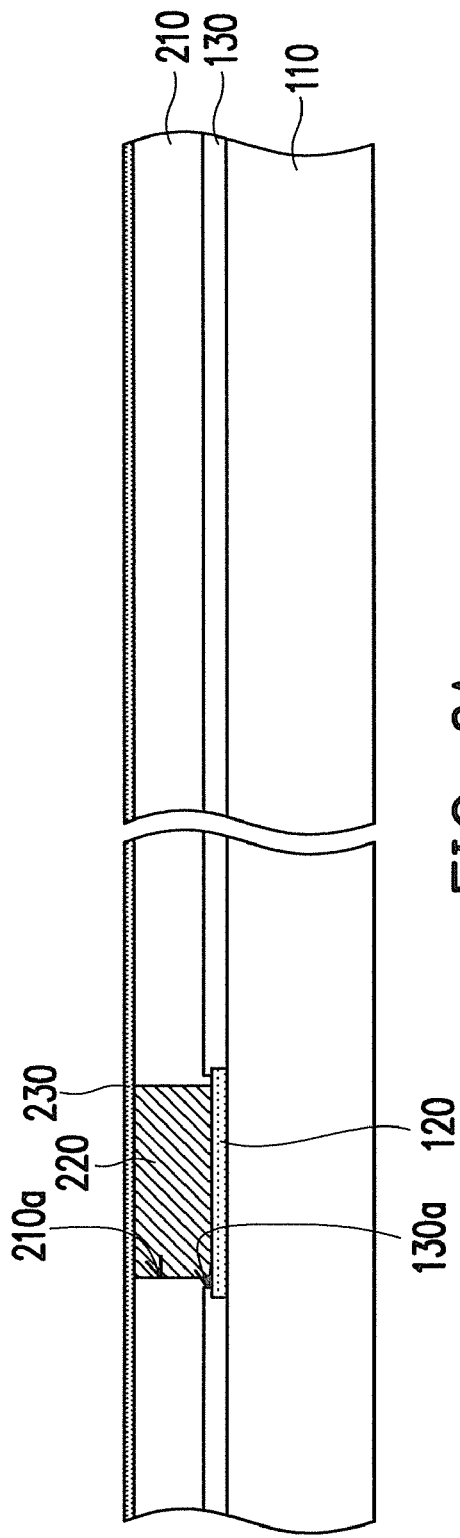

FIGS. 2A through 2D are schematic cross-sectional views showing a method of manufacturing a redistribution circuit structure according to a second embodiment of the present invention. As shown in FIG. 2A, the method of manufacturing the redistribution circuit structure in the present embodiment is similar to the first embodiment, mainly includes sequentially forming a first patterned photoresist layer 210, a first bump 220 and a UBM material layer 230.

Figure 2B:
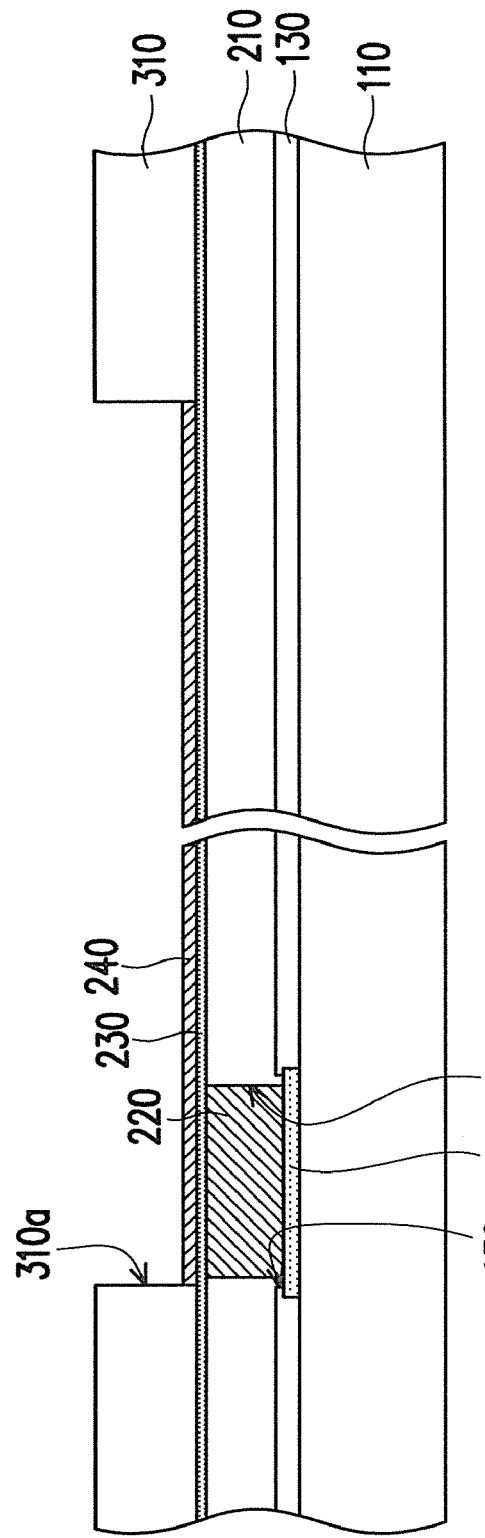

As shown in FIG. 2B, its content is similar to that depicted in FIG. 1B, mainly includes sequentially forming the second patterned photoresist layer 310 and the conductive lines 240 after forming the UBM material layer 230.

As shown in FIG. 2C, the second patterned photoresist layer 310 is removed after forming the conductive lines 240. Next, a third patterned photoresist layer 320 is formed on the UBM material layer 230 and a portion of the conductive lines 240. The third patterned photoresist layer 320 has a plurality of fourth openings 320a exposing a portion of the conductive lines 240. Then, a plurality of second bumps 250 is formed inside the fourth openings 320. The material of the second bumps 250 may be gold or other metal and the method of forming the second bumps 250 may include an electroplating process. Thereafter, the third patterned photoresist layer 320 is removed.

As shown in FIGS. 2C and 2D, an etching process is performed to remove a portion of the UBM material layer 230 and form a UBM layer 232 using the conductive lines 240 as a mask. Up to this point, the process of manufacturing the redistribution circuit structure of the present embodiment is substantially complete. Additionally, the substrate 110 may be cut to form a plurality of chips (not shown) after forming the UBM layer 232. The detail structure of a redistribution circuit is further described below.

As shown in FIG. 2D, the redistribution circuit structure in the present embodiment is similar to the first embodiment. The main difference is that the redistribution circuit structure in the present embodiment further includes a plurality of second bumps 250 disposed on the conductive lines 240. Therefore, a chip using this redistribution circuit structure may be applied to a chip package deploying the flip chip bonding technique. Furthermore, because the second bumps 250 are formed on flat conductive lines 240, the second bumps 250 have a flat top surface. Moreover, with the first patterned photoresist layer 210 disposed underneath the conductive lines 240, damages due to stress concentration are minimized when the bonding of a chip having this type of redistribution circuit structure is performed.

Third Embodiment

FIG. 3 is a schematic cross-sectional view of a redistribution circuit structure according to a third embodiment of the present invention. As shown in FIG. 3, the present embodiment is similar to the first embodiment. The main difference is that the redistribution circuit structure further includes a second under ball metal (UBM) layer 262 disposed inside the first opening 130a and located between the pad 120 and the first bump 220 when the pads 120 and the first bumps 220 are made from different materials. For example, if the pad 120 is made of aluminum and the first bump 220 is not made of aluminum, a second UBM layer 262 needs to be disposed between the pad 120 and the first bumps 220. In addition, the step of forming the second UBM layer 262 may include forming a second UBM material layer (not shown) over the passivation layer 130 to cover the pad 120 exposed by the first opening 130a. Furthermore, the method of forming the second UBM material layer may include a sputtering process, a physical vapor deposition process or a chemical vapor deposition process. After that, the second UBM material layer is patterned to form the UBM layer 262.

Fourth Embodiment

FIG. 4 is a schematic cross-sectional view of a redistribution circuit structure according to a fourth embodiment of the present invention. As shown in FIG. 4, the present embodiment is similar to the second embodiment. The main difference is that the redistribution circuit structure further includes a second UBM layer 262 disposed inside the first opening 130a and located between the pad 120 and the first bump 220 when the pad 120 and the first bump 220 are fabricated from different materials. For example, if the pad 120 is made of aluminum and the first bump 220 is not made of aluminum, a second UBM layer 262 needs to be disposed between the pad 120 and the first bump 220.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a redistribution circuit structure, comprising:
   providing a substrate having a plurality of pads and a passivation layer thereon, wherein the passivation layer has a plurality of first openings, and each of the first openings exposes a portion of the corresponding pad;
   forming a first patterned photoresist layer on the passivation layer, wherein the first patterned photoresist layer has a plurality of second openings, and each of the second openings exposes a portion of the corresponding pad;
   forming a plurality of first bumps inside the openings;
   forming a first under ball metal (UBM) material layer over the substrate to cover the first patterned photoresist layer and the first bumps;
   forming a plurality of conductive lines on the first UBM material layer above the first bumps; and patterning the first UBM material layer using the conductive lines as a mask to form a plurality of first UBM layers.

2. The method of claim 1, wherein the step of forming the conductive lines comprises:

forming a second patterned photoresist layer on the first UBM material layer, wherein the second patterned photoresist layer has a plurality of third openings exposing the first UBM material layer above the first bumps;

forming the conductive lines inside the second openings; and removing the second patterned photoresist layer.

3. The method of claim 1, further comprising forming a plurality of second bumps on the conductive lines after forming the conductive lines.

4. The method of claim 3, wherein the step of forming the second bumps comprises:

forming a third patterned photoresist layer on the UBM material layer a portion of the conductive lines, wherein the third patterned photoresist layer has a plurality of fourth openings exposing a portion of the conductive lines;

forming the second bumps inside the fourth openings; and removing the third patterned photoresist layer.

5. The method of claim 3, wherein a material constituting the second bumps comprises gold.

6. The method of claim 1, wherein a material constituting the conductive lines comprises copper.

7. The method of claim 1, wherein a material constituting the first bumps comprises aluminum.

8. The method of claim 1, further comprising forming a second UBM layer over the passivation layer to cover the pads exposed by the first openings before forming the first patterned photoresist layer when the pads and the first bumps are fabricated from different materials.

* * * * *